(12) United States Patent
Hirano et al.

(10) Patent No.: US 9,625,492 B2
(45) Date of Patent: Apr. 18, 2017

(54) CONTACT PROBE PIN

(75) Inventors: Takayuki Hirano, Kobe (JP); Takashi Kobori, Kobe (JP)

(73) Assignees: Kobe Steel, Ltd., Kobe-shi (JP); KOBELCO RESEARCH INSTITUTE, INC., Kobe-shi (JP)

( * ) Notice: Subject to any disclaimer, the term of this patent is extended or adjusted under 35 U.S.C. 154(b) by 123 days.

(21) Appl. No.: 13/883,698

(22) PCT Filed: Nov. 16, 2011

(86) PCT No.: PCT/JP2011/076444
§ 371 (c)(1),
(2), (4) Date: May 6, 2013

(87) PCT Pub. No.: WO2012/067161
PCT Pub. Date: May 24, 2012

(65) Prior Publication Data
US 2013/0222005 A1    Aug. 29, 2013

(30) Foreign Application Priority Data
Nov. 19, 2010  (JP) .................. 2010-259507

(51) Int. Cl.
*G01R 1/067* (2006.01)
*H01R 13/03* (2006.01)
(52) U.S. Cl.
CPC ..... *G01R 1/06738* (2013.01); *G01R 1/06761* (2013.01); *H01R 13/03* (2013.01)
(58) Field of Classification Search
USPC ........................................ 324/755.01–755.11
See application file for complete search history.

(56) References Cited

U.S. PATENT DOCUMENTS 6,016,061 A    1/2000  Mizuta
6,441,315 B1   8/2002  Eldridge et al.
(Continued)

FOREIGN PATENT DOCUMENTS

JP    8-166407       6/1996
JP    08-292209 A   11/1996
(Continued)

OTHER PUBLICATIONS

Written Opinion of the International Searching Authority Issued Feb. 21, 2012 in PCT/JP11/076444 Filed Nov. 16, 2011.
(Continued)

*Primary Examiner* — Daniel Miller
(74) *Attorney, Agent, or Firm* — Oblon, McClelland, Maier & Neustadt, L.L.P.

(57) ABSTRACT

The present invention provides a contact probe pin in which a carbon film having both of conductivity and durability is formed on a base material with a tip divided, wherein Sn adherence can be reduced as much as possible to be able to maintain stable electrical contact over a long period of time, even under such circumstances that the temperature of a usage environment becomes high. The present invention relates to a contact probe pin, including a tip divided into 2 or more projections and repeatedly coming into contact with a test surface at the projection, wherein a carbon film containing a metal element is formed at least on a surface of the projection, and a radius of curvature at an apex part of the projection is 30 μm or more.

16 Claims, 3 Drawing Sheets

(56) References Cited

U.S. PATENT DOCUMENTS

| | | |
|---|---|---|
| 6,667,629 B2 | 12/2003 | Souza et al. |
| 7,934,962 B2 | 5/2011 | Hirano et al. |
| 8,410,367 B2 | 4/2013 | Hirano et al. |
| 2001/0028111 A1 | 10/2001 | Suzuki et al. |
| 2003/0015347 A1 | 1/2003 | Eldridge et al. |
| 2003/0042403 A1* | 3/2003 | Joshi .......................... 250/214.1 |
| 2003/0087096 A1 | 5/2003 | Sato et al. |
| 2003/0102877 A1 | 6/2003 | Souza et al. |
| 2004/0070413 A1* | 4/2004 | Kasukabe .......... G01R 1/06744 324/754.07 |
| 2004/0177499 A1 | 9/2004 | Eldridge et al. |
| 2004/0209491 A1* | 10/2004 | Tokumo et al. ................ 439/66 |
| 2006/0040105 A1 | 2/2006 | Sato et al. |
| 2009/0261851 A1* | 10/2009 | Zhou et al. .................... 324/757 |
| 2010/0323551 A1 | 12/2010 | Eldridge et al. |
| 2013/0049784 A1 | 2/2013 | Hirano et al. |

FOREIGN PATENT DOCUMENTS

| | | |
|---|---|---|
| JP | 10 226874 | 8/1998 |
| JP | 11 38041 | 2/1999 |
| JP | 2000-035443 A | 2/2000 |
| JP | 2001 296312 | 10/2001 |
| JP | 2002-071748 A | 3/2002 |
| JP | 2002 318247 | 10/2002 |
| JP | 2003 231203 | 8/2003 |
| JP | 2003 329706 | 11/2003 |
| JP | 2005 32836 | 2/2005 |
| JP | 2005-504962 | 2/2005 |
| JP | 2006 38641 | 2/2006 |
| JP | 2006 208166 | 8/2006 |
| JP | 2007 24613 | 2/2007 |
| JP | 2009-025247 A | 2/2009 |
| JP | 2010 73698 | 4/2010 |

OTHER PUBLICATIONS

Japanese Office Action Issued Jan. 8, 2013 in Patent Application No. 2010-259507 Filed Nov. 19, 2010 (with English translation).
International Search Report Issued Feb. 21, 2012 in PCT/JP11/076444 Filed Nov. 16, 2011.

* cited by examiner

CONTACT PROBE PIN

TECHNICAL FIELD

The present invention relates to a contact probe pin, which is used for testing electrical properties of semiconductor elements and includes a configuration in which a tip is divided into a plurality of projections, and particularly to a contact probe pin having such excellent durability that conductivity is not deteriorated by repeated tests.

BACKGROUND ART

Electrical properties of electronic parts such as an integrated circuit (IC), a large-scale integrated circuit (LSI) and a light-emitting diode (LED) (in other wards, electronic parts using semiconductor elements) are tested by bringing probe pins into contact with electrodes of the semiconductor elements. Such probe pins (contact probe pins) used in test devices (semiconductor test devices) are required not only to have good conductivity (a low contact resistance value), but also to show a stable resistance value (the contact resistance value is not fluctuated) even by repeated contact with surfaces (test surfaces) of the electrodes to be tested.

The contact resistance value of the contact probe pins is generally set to about 100 mΩ or less. However, it is sometimes deteriorated to several hundred mΩ to several Ω by repeated tests on the test surfaces.

As a countermeasure thereto, regular cleaning or replacement of contact terminals has hitherto been carried out. However, this sometimes significantly lowers reliability of a test process and an operating rate, so that other countermeasures have been studied. In particular, a solder material, a Sn-plated electrode or the like has a property of being scraped off to easily adhere to surfaces of the contact terminals because of its softness, and a surface thereof is easily oxidized to cause high resistance, which makes it difficult to perform contact while maintaining a stable resistance value.

As a configuration of the contact probe pin to a metal, on the surface of which a high-resistance oxide film is formed, such as the solder material (for example, lead-free solder such as a SnAgCu alloy) or the Sn-plated electrode, a shape of a tip part thereof tends to be more sharpened, and development thereof has been made based on such a tendency. This is because in order to efficiently remove the oxide film of an other electrode to be brought into contact to maintain a good contact state, it is considered advantageous to have the sharp tip part. Further, even when the electrode material adheres (hereinafter sometimes represented by "Sn adherence") to the sharp shape, it is also considered that elimination force easily acts thereon.

As such a technology, for example, Patent Document 1 proposes a technology for realizing a reduction of the Sn adherence and efficient removal of an oxide film on a surface of an other electrode by forming a tip into a sharp shape by a specific production method and surface coating with a carbon-containing film. Further, Patent Document 2 proposes a technology for preventing grains scraped off from an other electrode from being deposited onto a tip of a contact probe pin by making a cut in a non-conductive layer of the other electrode with a sharp tip structure. From the viewpoints of efficiently removing the oxide film of the other electrode and preventing grains scraped off from the other electrode from being deposited onto the tip of the contact probe pin, it is a useful configuration to form the tip of the contact probe pin into a sharp shape as described above.

As a material for the contact probe pin, there has been used one in which a surface of a base material such as tungsten (W) or beryllium copper (Be—Cu) having a high hardness is plated with Au, Pd or the like. However, in the contact probe pin composed of this material, an electrode material (particularly, Sn) from a material such as a solder material or Sn plating easily adheres to the tip of the contact probe pin, and the adhered electrode material is surface-oxidized, which causes a problem that the contact resistance value of the contact probe pin becomes unstable.

As a method for reducing the problem due to the Sn adherence as described above to stabilize the contact resistance value, there has also been proposed a technology of coating a vicinity of a tip part of a contact probe pin (a tip part which comes into contact with an electrode and a vicinity thereof) with a carbon film (for example, Patent Documents 3 to 6). In this technology, it is an important requirement that an alloy element such as tungsten (W) is mixed in the carbon film represented by diamond like carbon (DLC) to obtain a surface film having both of low adhesion properties of the carbon film to a test surface (other electrode) and high conductivity resulting from an action of the mixed metal (or a carbide thereof).

On the other hand, as a mounting technology, a ball grid array (BGA) package has been widely used. In such a BGA package, an electrode thereof is in a configuration of halved ball-shaped solder. Further, the number of a mounting configuration of directly forming solder on a semiconductor wafer has increased. With respect to such a three-dimensional electrode, it is possible to realize stable contact by having a plurality of (two or more) projections (particularly, three or more projections). Furthermore, also with respect to an electrode having a flat surface, such as a conventional electrode of an electronic part, it comes to have functions of being able to also cope with a position gap, unanticipated biting of particles and the like by having a plurality of apexes (apex parts of projections).

PRIOR ART DOCUMENTS

Patent Documents

Patent Document 1: JP-A-2006-38641
Patent Document 2: JP-A-2010-73698
Patent Document 3: JP-A-10-226874
Patent Document 4: JP-A-2002-318247
Patent Document 5: JP-A-2003-231203
Patent Document 6: JP-A-2007-24613

SUMMARY OF THE INVENTION

Problems to be Solved by the Invention

The technology of coating the vicinity of the tip part of the contact probe pin with the carbon film is considered useful as the method for reducing the problem due to the Sn adherence to stabilize the contact resistance value. However, even when it is coated with the carbon film, there is a problem that the Sn adherence to the carbon film sometimes occurs under such conditions that the temperature of an electronic part becomes high, that is to say, under such conditions that the temperature of the other electrode to be brought into contact therewith becomes high.

The carbon film does not react with Sn and the like, and even when the temperature of Sn becomes high, no alloy is formed on a surface of the carbon film. Accordingly, compared to a conventional contact probe pin of a Au or Pd alloy, it has been considered that Sn tends to be difficult to adhere to the surface of the contact probe pin on which the carbon film is formed. Further, it has been considered that Sn which has adhered to the surface of the carbon film is relatively easily removed mechanically or chemically, which does not cause so much of a problem. However, Sn which hardly adheres at room temperature tends to increasingly adhere under high-temperature conditions of 90° C. or 130° C., and the problem due to the Sn adherence sometimes becomes obvious.

Sn or the solder material is originally soft even at room temperature, and it causes a problem that it is scraped off by contact with the contact probe pin and adheres to the contact probe pin. The hardness further decreases with an increase in temperature, resulting in an increase in this tendency. This is considered to be the reason that the Sn adherence proceeds. According to the confirmation by experiments of the present inventors, it has become clear that although Sn has a Vickers hardness of 8.9 Hv at room temperature (25° C.), the Vickers hardness decreases to 6.8 Hv at 85° C. The hardness of a Sn film cannot be directly measured as the Vickers hardness, so that the hardness shown in the above is obtained by converting the value measured by a nanoindentation method (Vickers hardnesses of 8.9 Hv and 6.8 Hv correspond to values obtained by the nanoindentation method of 0.117 GPa and 0.089 GPa).

The present invention has been made, giving attention to the circumstances as described above, and an object thereof is to provide a contact probe pin in which a carbon film having both of conductivity and durability is formed on a base material with a tip divided, wherein Sn adherence can be reduced as much as possible to be able to maintain stable electrical contact over a long period of time, even under such circumstances that the temperature of a usage environment becomes high.

Means for Solving the Problems

The present invention provides the following contact probe pin.

(1) A contact probe pin, comprising a tip divided into 2 or more projections and repeatedly coming into contact with a test surface at the projection, wherein a carbon film containing a metal element is formed at least on a surface of the projection, and a radius of curvature at an apex part of the projection is 30 μm or more.

The above-mentioned "radius of curvature" means the radius of curvature R at the above-mentioned apex part when it is observed on a plane (cross section) containing a shaft center of the contact probe pin. Further, the shape of this projection is not necessarily required to be rotationally symmetric, but in the case where this is not so, it shall be defined by the radius of curvature R of a cross section of the apex part in the steepest cross section.

Furthermore, the above-mentioned metal element is contained in the carbon film in a state of an elemental metal or a carbide (or in a mixed state).

(2) The contact probe pin according to (1), wherein the metal element is one or more kinds selected from the group consisting of W, Ta, Mo, Nb, Ti and Cr.

(3) The contact probe pin according to (1), wherein a content of the metal element is from 5 to 30 atomic %.

(4) The contact probe pin according to (2), wherein a content of the metal element is from 5 to 30 atomic %.

(5) The contact probe pin according to (1), wherein a thickness of the carbon film is from 0.1 to 5 μm.

(6) The contact probe pin according to (2), wherein a thickness of the carbon film is from 0.1 to 5 μm.

(7) The contact probe pin according to (3), wherein a thickness of the carbon film is from 0.1 to 5 μm.

(8) The contact probe pin according to (4), wherein a thickness of the carbon film is from 0.1 to 5 μm.

(9) The contact probe pin according to any one of (1) to (8), wherein the test surface to be tested contains Sn.

The effect of the contact probe pin of the present invention is effectively exhibited particularly when the test surface to be tested contains Sn.

Advantageous effects of the Invention

In the contact probe pin of the present invention, a carbon film containing a metal element is formed on a surface of a projection obtained by dividing a tip into two or more, and the radius of curvature at an apex part of the above-mentioned projection is adjusted to 30 μm or more. Accordingly, there can be realized the contact probe pin in which adherence of Sn and or like can be reduced as much as possible to be able to maintain stable electrical contact over a long period of time, even under such circumstances that the temperature of a usage environment is high.

EMBODIMENTS FOR CARRYING OUT THE INVENTION

Figure 1:
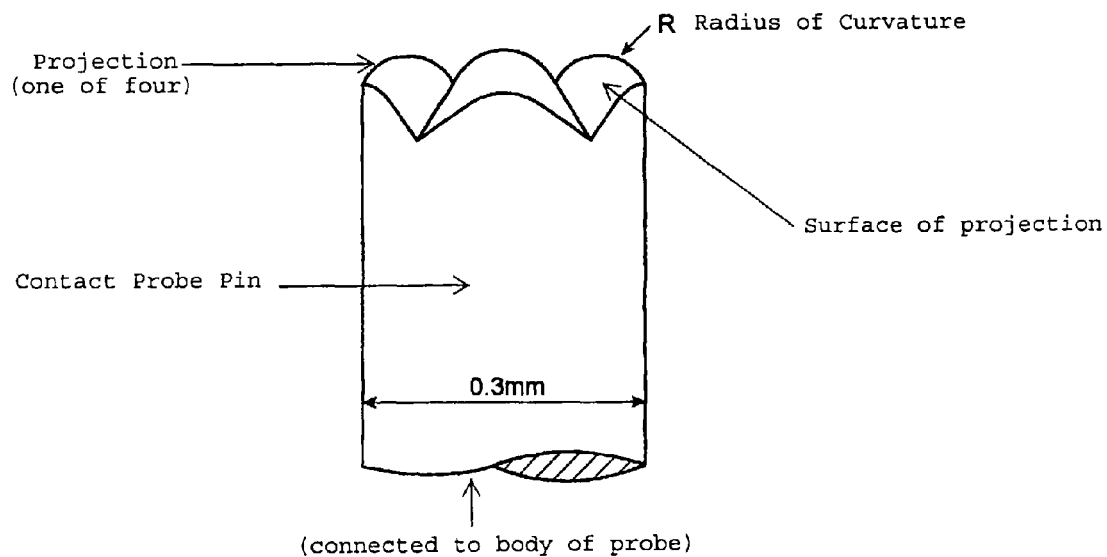
FIG. 1 is a schematic illustration showing an example of an appearance shape of a contact probe pin (Example) of the present invention.

As a constitution of a contact probe pin, it has been known that a tip thereof has a radius of curvature of 30 μm to about 100 μm, or a radius of curvature of 100 μm or more. However, this is employed exclusively for securing a stable contact area in many cases, and limited for a stable other electrode such as an Au electrode. This has been considered to be disadvantageous for other electrodes composed of a solder material, Sn or the like. Further, the contact probe pin having a large radius of curvature is limited to one having only one contact point (that is to say, one not having a plurality of projections), and for one having a plurality of projections (one having this shape is generally called a "crown shape"), one having a sharp tip with a small radius of curvature (for example, about 10 to 20 μm, or, less than 10 μm) has been employed.

From various angles without being fixed on the ready-made ideas, the present inventors have studied a configuration in which Sn adherence to a carbon film formed on apex parts of projections can be reduced as much as possible, in a contact probe pin with a tip divided into a plurality of projections. As a result, it has been found that Sn adherence or fluctuations in resistance caused thereby can be suppressed to be able to realize stable contact resistance by forming a carbon film containing a metal element on the above-mentioned projections and adjusting the radius of curvature of apex parts of the above-mentioned projections to 30 μm or more, thus completing the present invention.

Further, in terms of the shape (for example, a semispherical shape) of the other electrode to be brought into contact and the ease of processing the probe, it is preferred that the contact probe pin with the tip divided into the plurality of projections is rotationally symmetric and that the tip thereof is divided into about 4 to 8 projections. However, the present invention is not limited thereto.

In the contact probe pin of the present invention, the Sn adherence is stably reduced even under circumstances that the Sn adherence easily occurs at high temperature, and stable contact has been able to be continuously realized while efficiently removing a surface oxide film of a Sn-based electrode, by combination of the formation of the carbon film and the projection shape having a large radius of curvature.

The reason for effectiveness of the present invention, that is to say, a mechanism of reduction in the Sn adherence with the radius of curvature, is not clear, but can be assumed as follows. In the contact probe pin of the typical crown shape, contact traces having a depth of about 5 to 20 μm are formed on a solder material or Sn in many cases. That is to say, in the contact probe pin of the typical crown shape in which the tip has a radius of curvature of about 10 μm, contact traces larger than the radius of curvature are sometimes generated, resulting in repetition of contact with the other materials at a slope closer to verticality than a flat part or a gentle slope part of the probe.

In such portions, it is supposed that the other electrode comes into contact with a film surface so as to be strongly rubbed thereto in a transverse direction, and that Sn is scraped off by slight unevenness (derived from the base material) of the film surface to cause an increase in transfer possibility. Further, in the probe having a sharp shape, it is supposed that when a mechanical cutting work of the base material is performed or a thin film (including a Ni, Au or carbon film) is formed thereon, the condition in this case is different from that in the case of the flat part, and there is a possibility of a slight increase in unevenness due to cutting scratches or changes in film quality to cause the occurrence of an increase in the Sn adherence.

In contrast, by adjusting the radius of curvature of the apex part of the tip to 30 μm or more as in the contact probe pin of the present invention, the angle between surfaces to be contacted becomes 45° or less, which is close to a plane. This can be supposed to suppress the Sn adherence. Further, the carbon film containing the metal element is a material having a high hardness and high durability. However, plastic deformation of an underlying metal base material or a metal film can be prevented by increasing the radius of curvature of the apex part of the tip, and an effect of being able to exert higher durability is also exhibited.

According to the studies of the present inventors, it has been revealed that it is important in reducing the Sn adherence that the angle between contact surfaces of the carbon film and the other electrode (hereinafter sometimes referred to as the "contact angle") is approximately 45° or less to the original other electrode (before the plastic deformation). The sharper the angle becomes more than this, the more the Sn adherence becomes liable to occur even on the carbon film. On the other hand, a load of about several grams to several tens of grams, more specifically about 5 to 50 g, is generally applied to the contact probe pin at the time of contact. The electrode is deformed depending on the hardness of a material of the other electrode at this time, resulting in determination of the final contact angle. The present inventors have geometrically determined the maximum contact angle in the case where the above-mentioned radius of curvature is changed while applying a load of about 5 to 40 g. At that time, in the case of $SnAg_{3.0}Cu_{0.5}$ as a typical lead-free solder material, the contact area of the tip (apex part) of the contact probe pin to be contacted and the other electrode is about 2,000 to 3,000 $\mu m^2$ (with the proviso that the temperature is 85° C.). Under such conditions, it has become clear that the radius of curvature of the above-mentioned apex part is approximately 30 μm and that the contact angle is 45° or less.

In the contact probe pin of the present invention, the radius of curvature of at least the apex part of the tip is required to be 30 μm or more, from the relationship with the contact angle as described above, and it is preferably 50 μm or more. Further, also in the case where the radius of curvature is large, the effect of the present invention is exhibited, but from the viewpoint of removal of the oxide film of the other electrode, the radius of curvature is preferably 100 μm or less. However, this radius of curvature has only to meet this requirement in at least the apex part of the tip, and parts other than the apex part of the tip may be of a tapered form having no radius of curvature (a linear form when it is observed on the plane (cross section) containing the shaft center of the contact probe pin).

The contact probe pin of the present invention is constituted by forming the carbon film containing the metal element on the surface of the base material (the surface in the vicinity of the tip). As the base material used, for example, one composed of either a beryllium alloy (Be—Cu) or carbon tool steel is applicable, but it should not be construed as being limited thereto. Further, it has been known that a noble metal such as Au, Pd, a Au alloy or a Pd alloy is formed on the surface of the base material or a contact portion thereof with the electrode, and all of them are applicable to the base material used in the present invention. Alternatively, the base material itself may be composed of Au, Pd, a Au alloy, a Pd alloy or the like.

The carbon film is low in reactivity to the above-mentioned various base materials, and moreover, hard and also large in internal stress, so that it is difficult to be stably formed on the base material. From this, it has also been known that in order to enhance adhesion between the base material and the carbon film, it is effective to allow a Cr- or W-containing layer to intervene between them, and further to provide a gradient composition layer thereof as needed. Such constitutions may also be employed. In order to further improve the adhesion between the Cr- or W-containing layer and the surface of the base material, a layer composed of Ni or a Ni alloy is further allowed to intervene as an underlayer for the Cr- or W-containing layer as described above, thereby being able to firmly adhere the carbon film onto the surface of the base material composed of Au, Pd or the like. This is therefore preferred.

As a method for forming the carbon film on the surface of the base material of the contact probe pin, a CVD (chemical vapor deposition) method, a sputtering method or the like is applicable. Among these, according to the CVD method, because a hydrogen-containing gas is used as a raw material gas, hydrogen is contained in the carbon film, resulting in formation of only the carbon film having low properties. In contrast, when the sputtering method is applied, the carbon film having good properties can be formed. This is therefore preferred.

When the metal allowed to be contained in the carbon film is a metal which easily forms a carbide, it is uniformly dispersed in the carbon film to be kept in an amorphous and uniform state. From such a viewpoint, examples of the metals allowed to be contained in the carbon film include tungsten (W), tantalum (Ta), molybdenum (Mo), niobium (Nb), titanium (Ti), chromium (Cr) and the like. One or more of these metals can be used. Among these, tungsten is most preferred, considering stability of the carbide and availability at a low cost.

The metal contained in the carbon film takes a configuration of an elemental metal or a carbide (or a mixed state), from a manufacturing principle thereof, and the electrical resistance value of the carbon film is determined by the content thereof. The carbon film formed in the contact probe pin of the present invention exhibits the properties as described above, and the values thereof satisfy the contact resistance value and hardness required for tests. Then, from the viewpoint of satisfying the properties as described above, the content of the metal element in the carbon film of the tip of the contact probe pin is preferably from about 5 to 30 atomic %, and more preferably from 10 to 20 atomic %.

In the contact probe pin of the present invention, when the thickness of the carbon film is excessively thin, there is a concern that an effect of forming the carbon film is not exhibited. It is therefore preferably 0.1 μm or more. However, when the thickness of the carbon film is excessively thick, there is a concern that the resistant value is increased. It is therefore preferably 5 μm or less. The thickness of the carbon film is more preferably 0.2 μm or more and 2 μm or less.

As the test surface (other electrode) which is tested by the contact probe pin of the present invention, solder is usually used. This basically contains Sn, and this Sn is particularly easily adhered to the surface of the contact probe pin. Accordingly, in the case where the test surface is composed of Sn or a Sn alloy, when the contact probe pin of the present invention is applied, the effect thereof is particularly effectively exhibited. The Sn alloy is not particularly limited, and a conventional Sn alloy such as $SnAg_{3.0}Cu_{0.5}$ can be used.

The present invention will be more specifically described below with reference to examples, but it should be noted that the present invention is not restricted in any way by the following examples. It is of course possible to carry out the present invention with appropriate modification within the range conformable to the spirit described above and below. These are all included in the technical scope of the present invention.

EXAMPLES

As a contact probe pin, a spring built-in probe with a tip divided into four projections and with apex parts of the projections having a radius of curvature of 50 μm (R=0.05 mm) was prepared, as shown in FIG. 1 (a schematic illustration showing an example of an appearance shape). The entire tip has a diameter of 0.3 mm (300 μm). A surface of this contact probe pin was Au-plated, and a base material was made of Be—Cu (a commercial product). FIG. 1 schematically shows a state in which the tip is projected from a side surface, and the shape thereof is illustrated as three projections. Further, when it is come into contact with an other electrode to be pressed through a predetermined stroke by a function of the spring, a load of 30 gf (147 N/mm$^2$) is generated.

A carbon (graphite) target, a Cr target and a Ni target were each arranged in a magnetron sputtering apparatus, and the contact probe pin (base material) was arranged in a position opposed thereto. After the sputtering chamber was evacuated to $6.7 \times 10^{-4}$ Pa or less, Ar gas was introduced to adjust the pressure to 0.13 Pa. After Ar ion etching was performed by applying a high-frequency voltage to the base material, Ni of 50 nm in thickness and Cr of 50 nm in thickness were laminated and formed as an adhesion layer with the base material. Further, Cr- and a W-containing carbon film were alternatively formed, thereby forming an intermediate layer (thickness: 100 nm) as a gradient composition layer in which the ratio of the carbon film was gradually increased. Finally, during the formation of the carbon film of the outermost surface, the graphite target with a W chip placed thereon was allowed to perform DC magnetron discharge at an input power density of 5.66 W/cm$^2$, and a bias voltage of −100 V was applied to the base material, thereby performing coating so that a thickness thereof was about 400 nm (0.4 μm). At this time, the content of W of the outermost surface of the carbon film was adjusted to 5 to 10 atomic %.

Using the contact probe pin with the carbon film formed (the contact probe pin of the present invention), contacts were performed 100,000 times under the conditions of 130° C. to a sample obtained by processing lead-free solder having a composition of $SnAg_{3.0}Cu_{0.5}$ (manufactured by Senju Metal Industry Co., Ltd.) into a flat plate, and a state of Sn adherence on the tip (projections) was observed. Further, in order to confirm the presence or absence of stability of the electrical resistance value, a current of 100 mA was turned on for each contact, and changes in electric resistance value (fluctuations in resistance) were determined. The measurement of the resistance was made once per 100 contacts.

At this time, for comparison, (A) a contact probe pin with a carbon film, which was the same as the above except that the carbon film was formed on a probe having a crown shape in which projection parts of a tip had a radius of curvature of 10 μm and generating a load of 25 gf at a predetermined stroke (Comparative Example 1), (B) one in which only Au plating was performed on the same probe as in Comparative Example 1 (Comparative Example 2) and (C) one in which only Au plating was performed on a probe having a unitary shape of the tip projection in which the tip projection had a radius of curvature of 80 μm and generating a load of 25 gf at a predetermined stroke (Comparative Example 3) (the basic shape was the same as the case in FIG. 1) were also prepared. Then, also for these contact probe pins, a state of the tip after contact was observed, and the presence or absence of stability of the electrical resistance value was examined, in the same manner as described above.

Figure 2:
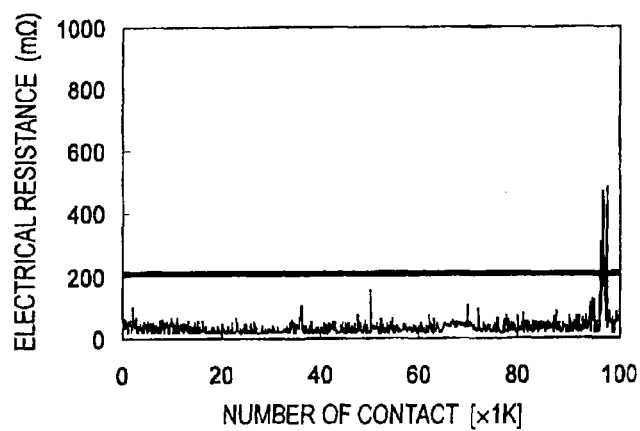
FIG. 2 is a graph showing changes in electrical resistance value in the case of using a contact probe pin of the present invention.
Figure 3:
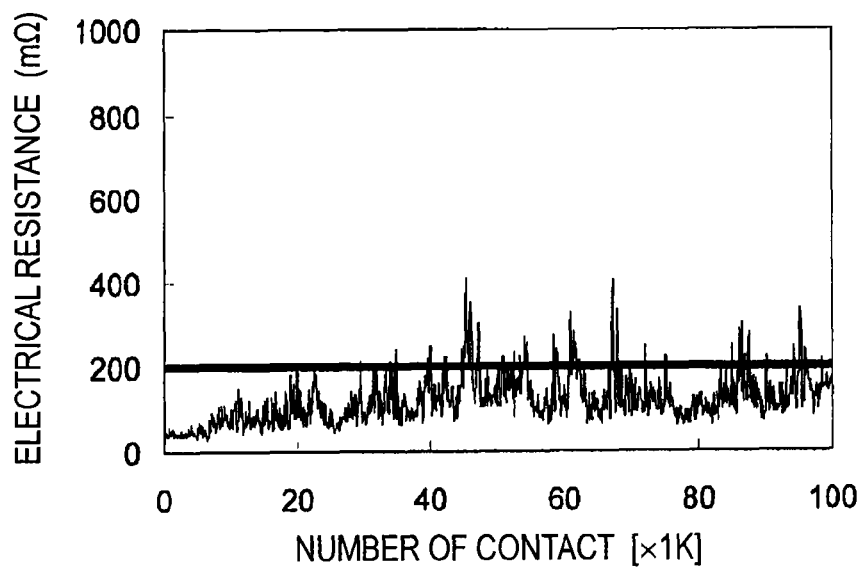
FIG. 3 is a graph showing changes in electrical resistance value in the case of using a contact probe pin of Comparative Example 1.
Figure 4:
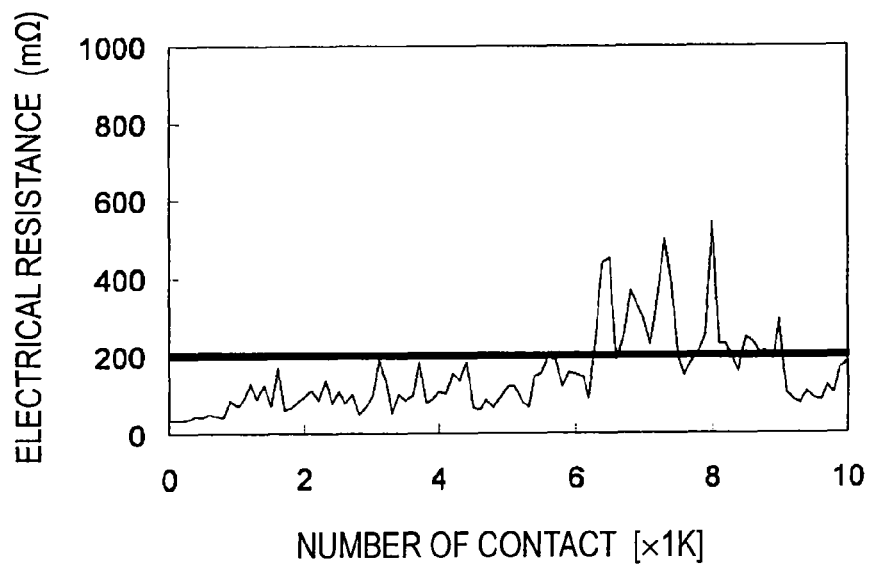
FIG. 4 is a graph showing changes in electrical resistance value in the case of using a contact probe pin of Comparative Example 2.

Changes in electrical resistance value (the relationship between the number of contacts and fluctuations in electrical resistance value) when the contact probe pin of the present invention (Example) was used are shown in FIG. 2. Changes in electrical resistance value (the relationship between the number of contacts and fluctuations in electrical resistance value) when the contact probe pin of Comparative Example 1 was used are shown in FIG. 3. Changes in electrical resistance value (the relationship between the number of contacts and fluctuations in electrical resistance value) when the contact probe pin of Comparative Example 2 was used are shown in FIG. 4. Changes in electrical resistance value (the relationship between the number of contacts and fluctuations in electrical resistance value) when the contact probe pin of Comparative Example 3 was used are shown in FIG. 5.

From these results, consideration can be made as follows. First, in the contact probe pin of the present invention (Example), it is found that the electrical resistance value appropriately equivalent to the initial value is maintained even after contacts were performed 100,000 times (FIG. 2). In the contact probe pin of Comparative Example 1, although the changes in electrical resistance value are small, a tendency that the resistance gradually increases is observed (FIG. 3). It is found that if the acceptable value of the changes in electrical resistance value is 200 mΩ, stable connection is possible 90,000 times or more for the contact probe pin of the present invention and up to about 20,000 times for the contact probe pin of Comparative Example 1, without performing an additional operation such as cleaning.

Figure 5:
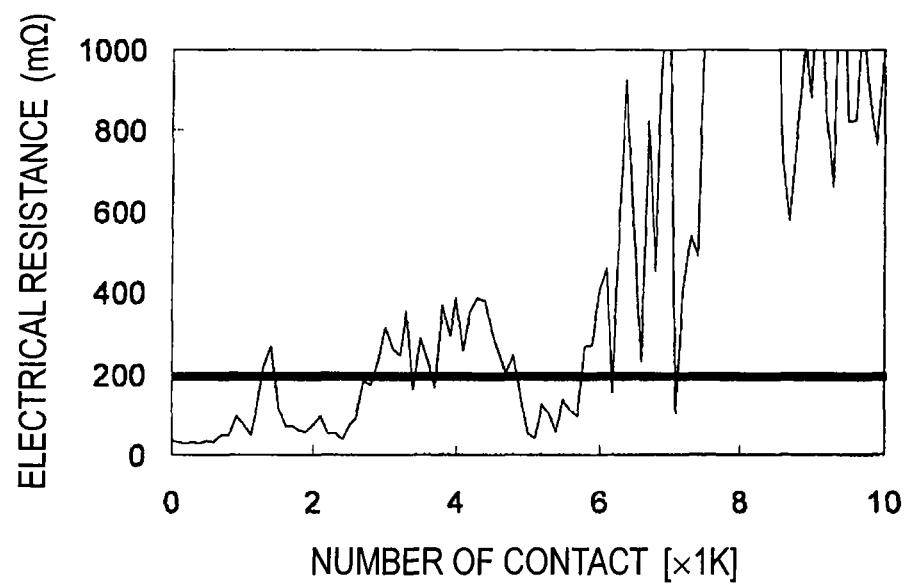
FIG. 5 is a graph showing changes in electrical resistance value in the case of using a contact probe pin of Comparative Example 3.

In contrast, in the contact probe pins of Comparative Examples 2 and 3 with no carbon films formed thereon, increases in electrical resistance value are observed early after contact (FIGS. 4 and 5). Accordingly, trends in resistance until initial 10,000 contacts are shown in FIGS. 4 and 5.

On the other hand, in view of the effect of the shape (the radius of curvature of tip projection part) of the contact probe pin, the changes in electrical resistance value in Comparative Example 3 is larger between the case of Comparative Example 2 and the case of Comparative Example 3, which reveals that one with a smaller radius of curvature has a tendency of the stable electrical resistance value, in the conventional Au-plated probe. However, in comparison of Example and Comparative Example 1, in the contact probe pin with the carbon film formed thereon, the effect of the radius of curvature of the tip projection part shows a tendency opposite to that in the conventional one, which reveals that the stable electrical resistance value is achieved with a larger radius of curvature (FIGS. 2 and 3).

In the respective contact probe pins, the following results were obtained for the state of the tip parts. First, in the contact probe pin of the present invention (Example), it has become obvious that an effective contact area (a state in which an original surface is exposed) of 500 μm² or more was maintained, even after contacts were performed 100,000 times.

In the contact probe pin of Comparative Example 1, although an effective contact area of 500 μm² or more was maintained after contacts were performed 10,000 times, almost the whole of a flat surface was covered with the Sn compound adhered after contacts were performed 100,000 times. Furthermore, in the contact probe pins of Comparative Examples 2 and 3, almost the whole of each flat surface was covered with the Sn compound adhered, before 10,000 contacts.

When the evaluation is performed as described above, the reason for defining a standard to 500 μm² is that when a contact area of 500 μm² is secured, even in the case where the carbon film having a high electrical resistance compared to a metal is formed, the resistance of the contact part can be basically maintained to a value as low as 10 mΩ or less.

While the present invention has been described in detail and with reference to specific embodiments thereof, it will be apparent to one skilled in the art that various changes and modifications can be made therein without departing from the spirit and scope thereof.

This application is based on Japanese Patent Application No. 2010-259507 filed on Nov. 19, 2010, the entire subject matters of which are incorporated herein by reference.

INDUSTRIAL APPLICABILITY

In the contact probe pin of the present invention, a carbon film containing a metal element is formed on a surface of a projection obtained by dividing a tip into two or more, and the radius of curvature at an apex part of the above-mentioned projection is adjusted to 30 μm or more. Accordingly, there can be realized the contact probe pin in which adherence of Sn and or like can be reduced as much as possible to be able to maintain stable electrical contact over a long period of time, even under such circumstances that the temperature of a usage environment is high.

The invention claimed is:

1. A method for measuring electrical property of a semiconductor element, the method comprising:
    contacting a contact probe pin with a test surface of the semiconductor element,
    wherein
    the contact probe pin comprises a tip divided into two or more projections each having an apex part with an apical radius of curvature of 30 μm or more and 100 μm or less,
    at least a surface of each said projection is coated with a film comprising carbon and a metal element, and
    a contact angle between contacted surfaces is 45° or less when said contacting between the apex part of each projection and the test surface occurs while a load of from 5 to 40 g is applied.

2. The method of claim 1, wherein said contacting occurs at a temperature of at least 85° C.

3. The method of claim 1, wherein said contacting occurs at a temperature of at least 90° C.

4. The method of claim 1, wherein said contacting occurs at a temperature of 130° C.

5. The method of claim 1, wherein the test surface comprises Sn.

6. The method of claim 1, wherein the tip is divided into three projections.

7. The method of claim 1, wherein the tip is divided into four to eight projections.

8. The method of claim 1, wherein the apical radius of curvature is from 30 μm to 50 μm.

9. The method of claim 1, wherein the apical radius of curvature is from 50 μm to 100 μm.

10. The method of claim 1, wherein said film has a metal content ranging from 5 to 30 atomic %.

11. The method of claim 1, wherein the metal element is at least one selected from the group consisting of W, Ta, Mo, Nb, Ti and Cr.

12. The method of claim 1, wherein said film comprises an elemental metal mixed with carbon.

13. The method of claim 1, wherein said film comprises a metal carbide.

14. The method of claim 1, wherein said film comprises tungsten or tungsten carbide.

15. The method of claim 1, wherein said film is at east 0.1 μm thick.

16. The method of claim 1, wherein said film has a thickness of from 0.1 μm to 5 μm.

* * * * *